United States Patent [19]
Fairley et al.

[11] Patent Number: 5,019,786
[45] Date of Patent: May 28, 1991

[54] PHASE MEASUREMENT SYSTEM USING A DITHERED CLOCK

[75] Inventors: Christopher R. Fairley, San Jose; Steven R. Patterson, Livermore, both of Calif.

[73] Assignee: The United States of America as represented by the United States Department of Energy, Washington, D.C.

[21] Appl. No.: 437,575

[22] Filed: Nov. 17, 1989

[51] Int. Cl.$^5$ ............................................. G01R 25/00
[52] U.S. Cl. ................................. 328/133; 324/83 D; 324/79 D
[58] Field of Search ............. 328/133; 324/830, 83 R, 324/79 D

[56] References Cited

U.S. PATENT DOCUMENTS

| | | | |
|---|---|---|---|
| 4,471,299 | 9/1984 | Elmis | 324/79 D |
| 4,600,994 | 7/1986 | Hayashi | 324/83 D |
| 4,607,218 | 8/1986 | Stosel | 324/83 D |
| 4,634,967 | 1/1987 | Virieux | 324/83 D |
| 4,970,638 | 11/1990 | Yeh et al. | 364/150 |
| 4,972,431 | 11/1990 | Keegan | 375/1 |

Primary Examiner—David Hudspeth
Assistant Examiner—Andrew Sanders
Attorney, Agent, or Firm—Michael Lee; L. E. Carnahan; William R. Moser

[57] ABSTRACT

A phase measurement system which measures the phase shift between two signals by dithering a clock signal and averaging a plurality of measurements of the phase differences between the two signals.

20 Claims, 3 Drawing Sheets

PHASE MEASUREMENT SYSTEM USING A DITHERED CLOCK

The U.S. Government has rights in this invention pursuant to Contract No. W-7405-ENG-48 between the U.S. Department of Energy and the University of Calif., for the operation of Lawrence Livermore National Laboratory.

BACKGROUND OF THE INVENTION

In interferometry, a reference signal is compared to a measured signal. The difference between the frequencies of these two signals is used to determine the velocity of an object. The phase difference between these two signals is used to determine the position of the object. The invention relates to an apparatus used to precisely measure cumulative phase differences between high frequency signals. The invention would also be useful in areas outside of interferometry, wherever precision measurements of cumulative phase differences between high frequency signals is desired.

The prior art requires that an apparatus which quickly measures small phase differences between signals must use a high-speed clock with a frequency on the order of the signal frequency divided by the fraction of a wavelength over which the phase difference is to be discernable. For example, if the measuring device has a clock frequency that is twice the signal frequency, then prior art measuring apparatus could measure a half wavelength phase difference. Whereas if the clock frequency is four times the signal frequency, a prior art phase difference measuring apparatus could measure a one-fourth phase difference.

There are devices in the prior art which do not require high clock speeds, but these devices are slow when measuring large cumulative phase differences with a high precision.

SUMMARY OF THE INVENTION

It is an object of the invention to precisely measure phase differences between two high frequency signals.

It is another object of the invention to quickly measure large phase differences between two high frequency signals.

It is another object of the invention to precisely measure the phase difference between two high frequency signals with an apparatus with a slow clock speed.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The invention adds a dithering signal to the clock signal in the measuring device to change the time at which the phases of the two measured signals are compared. The invention then averages the results over a period of the dithering signal to obtain the phase difference. Preferably, the measuring device is used in conjunction with a device that measures whole wavelength phase differences between the two measured signals.

The invention provides a circuit which uses two techniques to achieve phase resolution. First the frequency of a reference input signal is multiplied up by "n" via a phase-locked loop to generate a high frequency time base, clock signal, which is "n" times the frequency of the reference input signal. The clock signal is used as the prototype clock frequency. The number of periods of the clock signal between leading edges of the reference input signal and the measured input signal gives a coarse measure (1/n of a wavelength resolution) of their phase difference. The second technique is the use of dithering to further increase resolution. By dithering the input to an analog-to-digital converter and averaging the digital output over time, an increase in resolution can be achieved. Phase is used as the analog variable here. The analog-to-digital converter is the counter that counts the time between leading edges of the reference input signal and the measured input signal. Instead of dithering the phase of the measured input signal (the analog variable to be measured, which is the phase of the signal) the invention dithers the phase of the clock signal (analogous to dithering the trip points of the analog-to-digital converter).

DESCRIPTIONS OF THE PREFERRED EMBODIMENTS

Figures 1A, 1B, 1C:
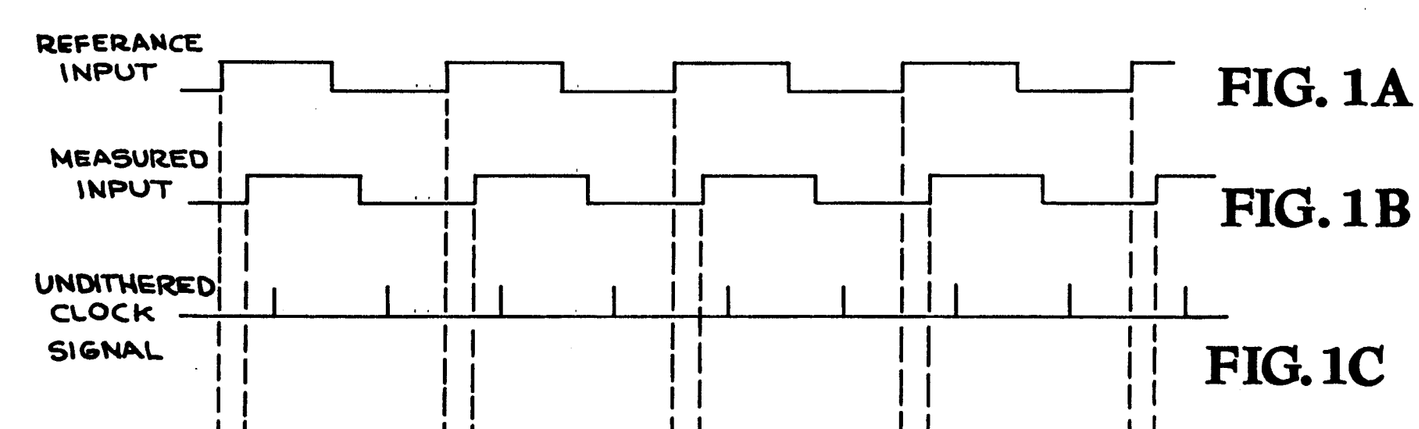
FIGS. 1a, 1b, 1c, 1d, 1e, and 1f are plots of signals with respect to time.
Figures 1D, 1E:
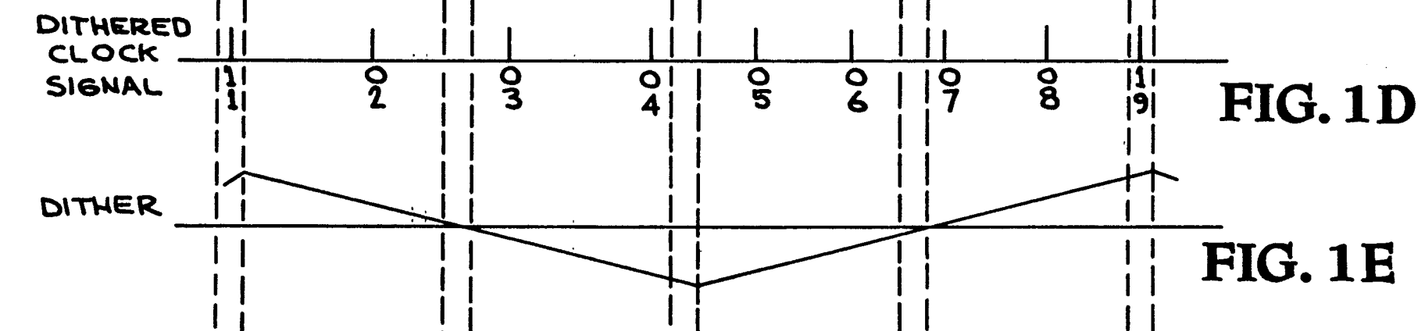

FIG. 1 gives a schematic example of how the inventive dithering system would be useful in phase comparison. FIG. 1a shows a reference input signal, and FIG. 1b shows a measured input signal, which are constantly slightly out of phase with respect to each other. FIG. 1c shows an undithered clock signal that has a frequency which is N times the frequency of the reference signal (N being a rational number in general and N=2 for FIG. 1c) so that phase differences between the reference signal frequency and the measured signal frequency can be resolved to 360°/N (for N=2 the phase frequency can be resolve to 180°). Only the rising edges of the clock signal are shown as vertical lines, since measurements will only be triggered by the rising edges. In this specification, any point on a wavelength of a timing signal that triggers the measurement system may be considered a rising edge. There are many ways to compare the phase difference between two signals. To simplify the explanation of the invention in this example at the times when a rising edge of the clock signal is encountered, the reference signal is compared to the measured signal. If both signals are at a peak or both are at a valley when they are compared, then they are considered in phase. If one is at a peak and the other at a valley when they are compared, then they are considered 180° out of phase. It can be seen from FIG. 1 that when the undithered clock signal causes the signals to be measured the signals are either both at peaks or both at valleys. Thus, using an undithered clock signal the detector would indicate that the signals are always in phase. FIG. 1e also shows a triangle wave integrated dithering signal. This triangle wave integrated dithering signal modulates the phase of the undithered clock signal to yield a dithered clock signal as shown in FIG. 1d. The amplitude of the integrated dithering signal graph indicates the phase shift of the undithered clock signal, yielding the shown dithered clock signal (only the rising edges of the dithered clock signal are shown). In the simplified example shown in FIG. 1, if the reference and measured signals are both at peaks or both at valleys when they are measured, a value of zero is assigned. If one signal is at a peak and the other at a valley when they are measured, then a value of one is assigned. These values are averaged over one period of the dithering signal so that the average equals the sum of the values in a period of the dithering signal divided by the number of data points in a period of the dithering signal. So if the waves are completely in phase (0°), then the average value is zero. If the waves are half a wavelength 180° out of phase, the average value is one. The integrated dithering signal in FIG. 1e is a triangle wave with one period of the dithering signal encompassing 8 clock signals. The integrated dithering signal modulates the phase of the undithered clock signal to yield the shown dithered clock signal. Below the dithered clock signal shown in FIG. 1d, are the values assigned to each clock signal as described above. The first rising edge of the dithered clock signal in the illustration is not counted, since it is not within the full period of the dithering signal going from the first peak of the dithering signal to the second peak of the dithering signal. The sum of these values is one. So the average value is $\frac{1}{8}$. This means that the waves are $\frac{1}{8}$ out of phase or 22.5° out of phase. This is more precise than the value given by the undithered clock signal.

Figure 2:
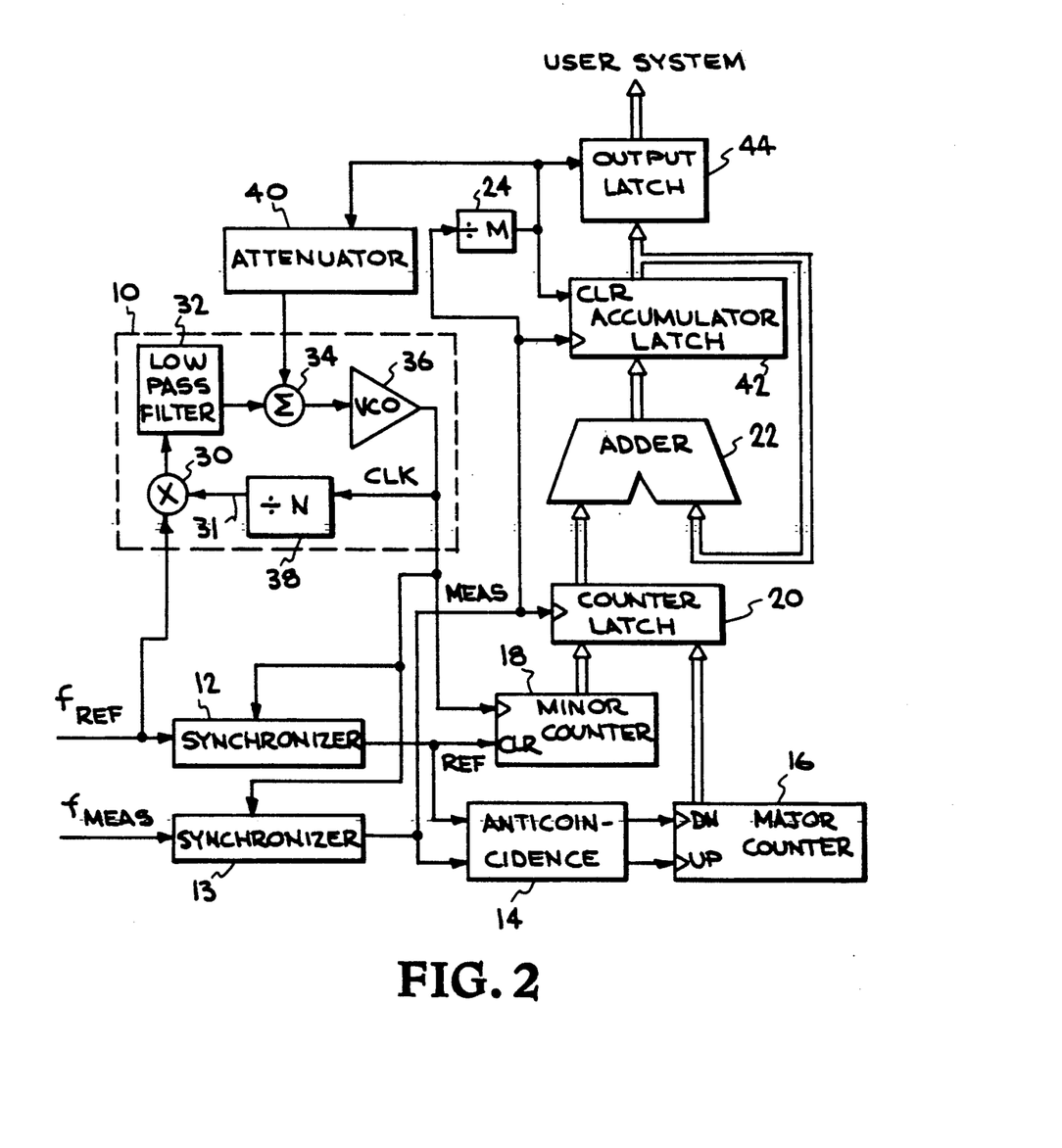
FIG. 2 is a block diagram of a preferred embodiment of the invention.

FIG. 2 is a block diagram of an embodiment of the invention. The purpose of the apparatus shown in FIG. 2 is to measure and accumulate the phase difference between a reference input signal $f_{ref}$ and a measured input signal $f_{meas}$ from a laser interferometer system. In such a system the measured frequency would be the doppler shifted version of the reference frequency. Then the frequency difference between $f_{ref}$ and $f_{meas}$ would indicate velocity, and the phase difference, which would be the integral of the frequency difference, would indicate position. In this specification, any point on a wavelength of a sampled signal that triggers the measurement system is the leading edge of a wave.

$f_{ref}$, the reference input signal, and $f_{meas}$, the measured input signal, were fed as inputs to the apparatus illustrated in FIG. 2. $f_{ref}$ was fed to a phase-locked loop (shown as broken box 10). In the phase-locked loop the frequency of the reference input signal was multiplied up eight times to generate a high frequency time base clock signal. A dithering signal was added to the clock signal in the phase-locked loop 10 so that the phase-locked loop 10 produces a dithered clock signal. $f_{ref}$ was also fed to a synchronizer 12 which synchronizes $f_{ref}$ with the dithered clock signal (CLK) yielding a synchronized reference signal (REF). Likewise, $f_{meas}$ was fed to a synchronizer 13 which synchronizes $f_{meas}$ to the dithered clock signal yielding a synchronized measured signal (MEAS). MEAS and REF were fed into an anticoincidence device 14. Generally, when the two signals have leading edges that are close together, the synchronizers caused these leading edges to coincide with each other. If the signals coincide, then neither signal was passed through the anticoincidence device 14 to a major up down counter 16. If a leading edge was detected from one signal without a leading edge coincidently detected from the other signal, then the signal was passed through the anticoincidence counter 14 to the major up down counter 16. If the leading edge was from MEAS, then the major counter 16 added one to the count. If the leading edge was from REF, then the major counter 16 subtracted one. Starting from zero, the major counter 16 counted full wavelength phase differences between the two signals. For example, if the object being measured moved a certain distance and is now motionless, the major counter 16 will toggle between M and M+1 or the anticoincidence device 14 will not pass either signal and the major counter 16 will remain at M or M+1. Now as the object is moved closer to the signal generator so that $f_{meas}$ is shifted to lag by a full wavelength, the major counter 16 will have one more down count than up counts causing the major counter 16 to toggle between M and M−1, or to remain at M or M−1. The output of the major counter 16 was continuously fed into a counter latch 20.

The minor counter 18 counted periods of CLK continuously, and its count sequence was synchronized to REF. A leading edge of REF loaded the minor counter 18 to all ones, which in this embodiment yields a value of 111 base two or 7 base ten, and CLK counted it down by one to zero. The minor counter 18 has the same modulus as the divide-by-N counter 38 (in this embodiment N=8) in the phase-locked loop 10, so once synchronized to REF it should never need synchronization again (the minor counter 18 output should always be zero when REF loads it to all ones.) As a result the value in the minor counter was always greater than or equal to zero. The output of the minor counter 18 was also continuously fed to counter latch 20. The counter latch 20 summed the value in the major counter 16, which indicated the full wavelength phase difference between $f_{meas}$ and $f_{ref}$, with the value in the minor counter 18 divided by N (in this embodiment N=8), which indicated the 1/N wavelength phase difference between $f_{meas}$ and $f_{ref}$. Since in this embodiment the actual calculations are performed in base two, some of the numbers will be given in base two. When calculating in base two a binary point is used instead of a decimal point. The summing of the value in the major counter 16 with the value in the minor counter 18 in the counter latch 20 occurs by placing the value in the major counter 16 to the left of a binary point and the value in the minor counter 18 to the right of the binary point. The value in the major counter 16 will indicate in base two the number of full wavelength phase differences between $f_{ref}$ and $f_{meas}$. The value in the minor counter 18 when placed to the right of the binary point will indicate the partial wavelength phase differences between $f_{ref}$ and $f_{meas}$ to an accuracy of 1/N, where N must be a power of two, and wherein in this embodiment N=8. MEAS was used to trigger the counter latch 20 and send its output to an adder 22, so that the value sent to the adder 22 indicated the phase difference between $f_{meas}$ and $f_{ref}$ with an accuracy of 1/N ($\frac{1}{8}$ in this embodiment) of a wavelength.

In phase-locked loop 10, a summing unit 34 was added to a conventional phase-locked loop. Phase-locked loop 10 uses a phase detector 30, which in this embodiment is a multiplying circuit that multiplied $f_{ref}$ with a divided down output signal passed along conductor 31, which in the normal phase-locked condition yielded an ac component which was related to the signal frequency and a dc component, which is present only during phase lock, and which was related to the phase difference between $f_{ref}$ and the divided down output signal. The output of the multiplying circuit 30 was directed through a low pass filter 32, which filtered the ac component of the output, to a summing circuit 34 which summed the remaining dc output with the dithering signal described below. The output of the summing circuit 34 was used as input to a voltage controlled oscillator (VCO) 36. The VCO 36 is a voltage controlled oscillator with a variable output frequency centered on approximately eight times the frequency of $f_{ref}$. The voltage input to the VCO 36 caused an approximately proportional frequency shift in the VCO output signal, with a corresponding phase shift in the VCO output signal. The output of the VCO 36 was used as CLK, and was directed to the synchronizers 12 and 13, the minor counter 18 and a frequency divider 38. The frequency divider 38 divided the frequency by eight and fed the output to the phase detector 30 along conductor 31. In a conventional phase-locked loop the phase and frequency of the VCO output signal will continue to shift until the VCO output signal has a constant phase difference from $f_{ref}$ and has eight times the frequency of $f_{ref}$.

The inventive apparatus generated a square wave dithering signal from MEAS and used the dithering signal to average a plurality of measurements. The dithering signal was generated by dividing down MEAS. By deriving the dithering signal from MEAS we assure that sampling of the phase measurement was synchronous with the dithering signal. In this embodiment, this was accomplished by feeding MEAS into a signal divider 24. In this embodiment, MEAS was divided down by ten, causing the dithering frequency to be a tenth of the frequency of MEAS. The dithering signal was attenuated at an attenuator 40, which lowered the amplitude voltage of the dithering signal to a predetermined voltage while maintaining the dithering signal waveshape, and fed to the phase-locked loop 10 at the summing unit 34, which summed the amplitude voltage of the square wave dithering signal with the phase-locked loop control voltage in front of the VCO. Since the VCO output frequency was proportional to its input voltage, the VCO output phase tracks the integral of the input voltage. Since the square wave dithering signal was integrated by the VCO, the square wave dithering signal produced a triangle wave variation in phase.

The triangle wave variation in phase of the clock signal dithered the clock signal so that it measured the difference in phase between $f_{ref}$ and $f_{meas}$ at different times. Although a triangle wave variation is used in the embodiments, the invention also allows the use of other types of dithering variation. The phase differences were then averaged together over the period of a dithering signal to produce a more precise phase difference measurement.

As described above, MEAS caused the value in the counter latch 20 to be sent to the adder 22. MEAS also caused the value in an accumulator latch 42 to be sent to the adder 22 at the same time as the value from the output of the counter latch 20 was sent to the adder 22. The adder 22 added the value from the counter latch 20 with the value from the accumulator 42. The sum from the adder was stored in the accumulator 42, so that the accumulator 42 kept a running sum of values from the counter latch 20. The sum was sent from the accumulator to an output latch 44. As described above the square wave dithering signal was MEAS divided down in this embodiment by ten. When the dithering signal went through a full period, which was ten times the period of MEAS, the output latch 44 would send the accumulated value to a user system, and the accumulator was cleared setting its value to zero. Thus the value sent to the user system was ten times the average phase difference between $f_{ref}$ and $f_{meas}$.

To clarify the operation of the preferred embodiment, the operation of a similar embodiment will be discussed. The present embodiment is exactly like the preferred embodiment, except that the clock speed is only twice the frequency of $f_{ref}$ and the dithering signal has a period which is four times the period of the synchronized measured signal. This difference makes the explanation of the operation of the embodiment less complex so that FIG. 1 could be used to explain the operation of the present embodiment.

As described before, FIG. 1a represents a reference input signal, plotted by amplitude versus time. FIG. 1b represents a measured input signal, which is out of phase with the reference signal. If the leading edges of the reference input signal were aligned with the leading edges of the measured input signal, the reference input signal would be six wavelengths out of phase with the measured input signal in this example. The leading edges of the measured input signal lag by about one eighth of a wavelength making the measured input signal about 5 ⅛ wavelengths out of phase with the reference input signal as shown in this example. The reference input signal, illustrated in FIG. 1a, is fed into the phase detector, which in this embodiment is the frequency multiplier 30, in the phase-locked loop and a synchronizer 12 shown in FIG. 2. The phase-locked loop 10 uses the reference input signal to generate a dithered clock signal CLK, as described below. The synchronizer 12 synchronizes the reference input signal with the dithered clock signal from the phase-locked loop. Synchronizer 12 passes the leading edge of the reference input signal when it is triggered by a subsequent rising edge of the dithered clock signal CLK.

The measured input signal, illustrated in FIG. 1b, is fed into synchronizer 13 shown in FIG. 2. Synchronizer 13 synchronizes the measured input signal with the dithered clock signal from the phase-locked loop, so that it passes the leading edge of the measured input signal when it is triggered by a subsequent rising edge of the dithered clock signal. The synchronized measured signal is passed to a frequency divider 24 of FIG. 2, which in this embodiment divides the frequency of the synchronized measured signal by four yielding the dithering signal illustrated in FIG. 1f, which has a period which is four times the period of the synchronized measured signal.

The dithering signal was passed through an attenuator 40, which lowered the amplitude voltage of the dithering signal to a predetermined voltage while maintaining the dithering signal waveshape. The attenuated dithering signal is then summed into the phase-locked loop 10 at summing unit 34. The summing of the dithering signal integrates the dithering signal as shown in FIG. 1e. When the phase-locked loop signal is summed with the dithering signal a dithered clock signal as illustrated in FIG. 1d results.

The synchronized reference and measured signals are fed into an anticoincidence counter 14. The first leading edge of the reference input signal is passed through synchronizer 12 at the first subsequent rising edge of the dithered clock signal labeled 1 in FIG. 1d. Since there is not any preceding leading edge for the measured input signal, the synchronized reference signal is passed through the anticoincidence device 14 to the major counter 16. Since the synchronized reference signal is passed to the major counter 16, the major counter is decremented by one, which for this example sets the value in the major counter from six to five or 101 base two. The synchronized reference signal is also sent to the minor counter 18, which sets all of the registers in the minor counter 18 to ones yielding a value in base two, which for this example is one. The first rising edge of the dithered clock signal does not affect the value in the minor counter, since it is coincident with a leading edge of the synchronized reference signal. The value from the major counter is sent to the counter latch in a register to the left of the binary point, and the value in the minor counter is placed to the right of the binary point, yielding the value 101.1 base two or 5.5 base ten.

Figure 1F:
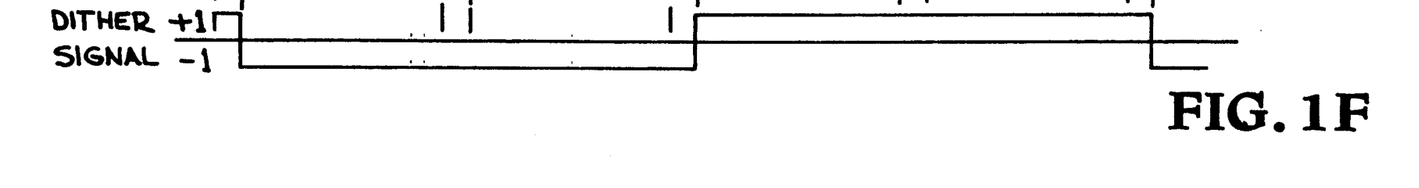

Subsequent to the first rising edge of the dithered clock signal is a falling edge of the dithering signal shown in 1f. The falling edge of the dithering signal caused the sum in the output latch to be sent to the user system, and then the value in the accumulator was set to zero.

At the second rising edge of the dithered clock signal, shown in FIG. 1d and labeled 2, there was a leading edge for the measured input signal, which preceded this rising edge of the dithered clock signal and was subsequent to the previous rising edge of the dithered clock signal. The leading edge of the measured input signal was passed at the time of the rising edge of the dithered clock signal, through synchronizer 13, yielding a leading edge for the synchronized measured signal. The leading edge of the synchronized measured signal sends the value in the counter latch 20 to the adder 22, which adds this value to the value in the accumulator latch 42, which was initialized to zero, yielding a value of 101.1 base two or 5.5 base ten. The 101.1 base two value is stored in the accumulator latch 42 and the output latch 44. After the counter latch value is sent to the adder 22, the dithered clock signal counts the value stored in the minor counter 18 down by one to zero. The leading edge of the synchronized measured signal is directed to the anticoincidence device 14. Since the leading edge of the synchronized measured signal is not coincident with a leading edge of the synchronized reference signal, anticoincidence device 14 passes the signal to the major counter 16. Since the signal passed to the major counter is from the synchronized measured signal, the value in the major counter 16 is counted up by one to a value of six in this example. The new value of six in the major counter 16 is sent to the counter latch, which places the six value to the left of the binary point, and places the 1 value of the minor counter to the right of the binary point, yielding a value of 110.0 base two.

The third rising edge of the dithered clock signal, shown in FIG. 1d and labeled 3, is preceded by leading edges for both the reference input signal and the measured input signal. Both leading edges are synchronized with the third rising edge of the dithered clock signal. The leading edge of the synchronized measured signal sends the value 110.0 base two in the counter latch 20 to the adder 22, which sums the value in the accumulator 42, which is 101.1 base two, with the value from the counter latch 20, to yield the value 1011.1 base two. The minor counter 18 is set to one by the leading edge of the synchronized reference signal. The synchronized leading edges are passed to anticoincidence device 14. Since the leading edge of the synchronized reference signal is coincident with the leading edge of the synchronized measured signal, neither signal is passed to the major counter 16, leaving the value in the major counter 16 at six. Therefore, the value in the counter latch 20 is 110.1.

The fourth rising edge of the dithered clock signal, shown in FIG. 1d and labeled 4, is not preceded by a leading edge for either the reference input signal or the measured input signal. Since there is no leading edge of the synchronized measured signal the value in the counter latch 20 is not accumulated in the accumulator latch 42. The value in the major counter is left unchanged at 110 base two. The minor counter 18 is counted down from one to zero by the rising edge of the dithered clock signal. The value in the counter latch 20 is 110.0 base two, since there is a 110 base two value in the major counter 16, and the value in the minor counter is zero.

The fifth rising edge of the dithered clock signal, shown in FIG. 1d and labeled 5, is preceded by leading edges for both the reference input signal and the measured input signal. Both leading edges are synchronized with the fifth rising edge of the dithered clock signal. The leading edge of the synchronized measured signal sends the value 110.0 base two in the counter latch 20 to the adder 22, which sums the value in the accumulator 42, which is 1011.1 base two, with the value from the counter latch 20, to yield the value 10001.1 base two. The minor counter 18 is then set to one by the leading edge of the synchronized reference signal. The synchronized leading edges are passed to anticoincidence device 14. Since the leading edge of the synchronized reference signal is coincident with the leading edge of the synchronized measured signal, neither signal is passed to the major counter 16, leaving the value in the major counter 16 at 110 base two. Therefore, the value in the counter latch 20 is 110.1 base two.

The sixth rising edge of the dithered clock signal, shown in FIG. 1d and labeled 6, is not preceded by a leading edge for either the reference input signal or the measured input signal. Since there is no leading edge of the synchronized measured signal the value in the counter latch 20 is not accumulated in the accumulator latch 42. The value in the major counter is left unchanged. Then minor counter 18 is counted down from one to zero by the rising edge of the dithered clock signal. The value in the counter latch 20 is 110.0 base two.

The seventh rising edge of the dithered clock signal, shown in FIG. 1d and labeled 7, is preceded by leading edges for both the reference input signal and the measured input signal. Both leading edges are synchronized with the seventh rising edge of the dithered clock signal. The leading edge of the synchronized measured signal sends the value 110.0 base two in the counter latch 20 to the adder 22, which sums the value in the accumulator 42, which is 10001.1 base two, with the value from the counter latch 20, to yield the value 10111.1 base two. The minor counter 18 is then set to one by the leading edge of the synchronized reference signal. The synchronized leading edges are passed to anticoincidence device 14. Since the leading edge of the synchronized reference signal is coincident with the leading edge of the synchronized measured signal, neither signal is passed to the major counter 16, leaving the value in the major counter 16 at 110 base two. Therefore the value in the counter latch 20 is 110.1 base two.

The eighth rising edge of the dithered clock signal, shown in FIG. 1d and labeled 8, is not preceded by a leading edge for either the reference input signal or the measured input signal. Since there is no leading edge of the synchronized measured signal the value in the counter latch 20 is not accumulated in the accumulator latch 42. The minor counter 18 is counted down from one to zero by the rising edge of the dithered clock signal. The value in the major counter is left unchanged at 110 base two. The value in the counter latch 20 is 110.0 base two.

The ninth rising edge of the dithered clock signal is preceded by a reference input signal, but not by a measured input signal. Since the ninth rising edge of the dithered clock signal is not preceded by a leading edge of the measured input signal, the value in the counter latch is not sent to the adder. Since there is not any preceding leading edge for the measured input signal, the synchronized reference signal is passed through the anticoincidence device 14 to the major counter 16. Since the synchronized reference signal is passed to the major counter 16, the major counter is decremented by one, which for this example sets the value in the major counter from 110 base two to 101 base two. The synchronized reference signal is sent to the minor counter 18, which sets all of the registers in the minor counter 18 to ones yielding a value in base two of one. The value from the major counter is sent to the counter latch in a register to the left of the binary point, and the value in the minor counter is placed to the right of the binary point, yielding the value 101.1 base two. The ninth rising edge of the dithered clock signal does not affect the value in the minor counter, since it is coincident with a leading edge of the synchronized reference signal.

After the ninth dithered clock signal a rising edge of the dithering signal is encountered, causing the value in the output latch 44, which is 10111.1 base two in this example, to be sent to the user system, which is not shown. The accumulator and adder are then reset to zero.

The value sent to the user system, 10111.1 base two which is 23.5 base ten, is four times the value of the average phase shift between the reference input and the measured input. The average phase shift between the reference input signal and the measured input signal is 23.5/4 or 5 7/8 wavelengths.

Figure 3:
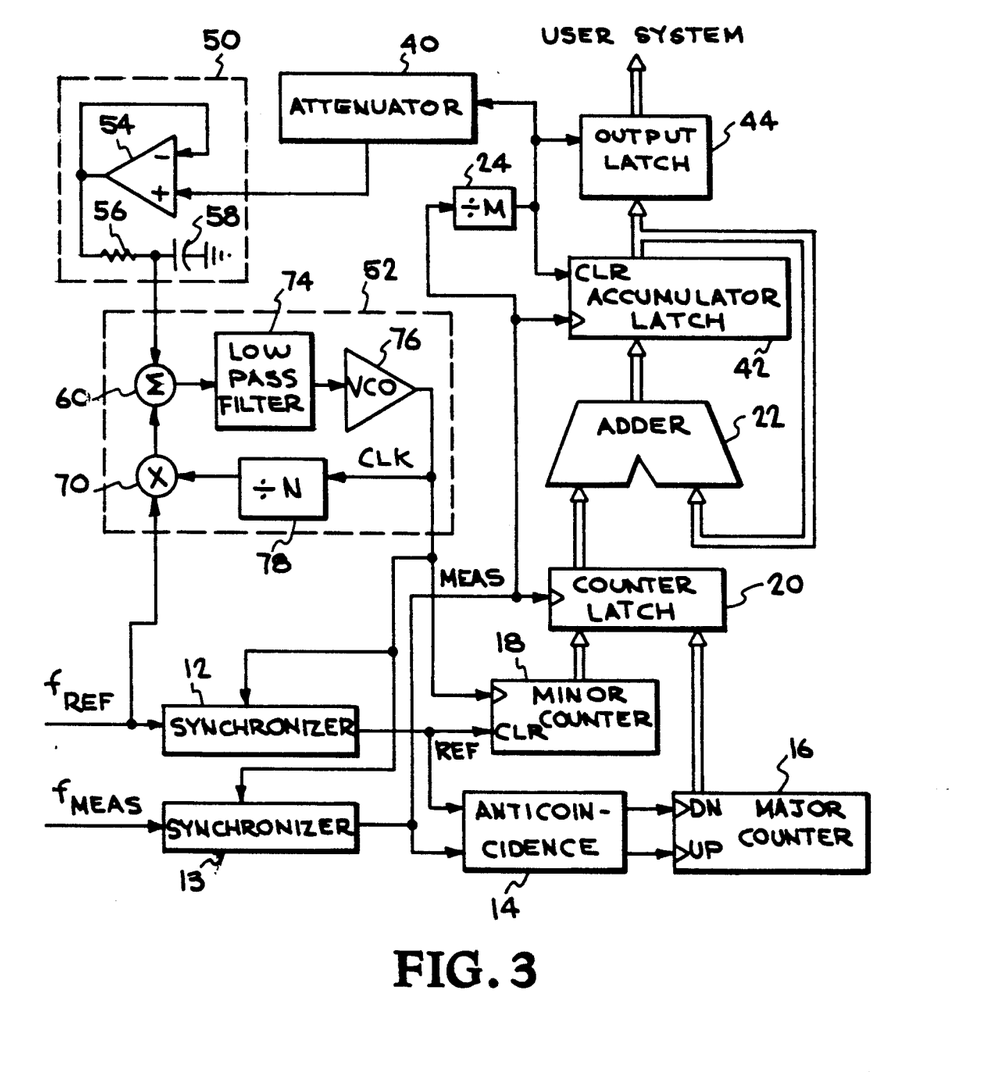
FIG. 3 is a block diagram of another embodiment of the invention.

FIG. 3 is a schematic of another embodiment of the invention. The present embodiment in FIG. 3 differs from the previous embodiment in FIG. 2, in that the present embodiment adds a square wave to triangle wave circuit 50, and uses a different phase-locked loop 52. The previous embodiment requires that the dithering signal frequency is outside of the bandwidth of the phase-locked loop. The present embodiment allows the dithering signal frequency to be inside the bandwidth of the phase-locked loop. Since the present embodiment is almost identical to the previous embodiment, the present embodiment works almost identically to the previous embodiment. In the present embodiment the square wave from the synchronized measured signal, divided down at frequency divider 24 and passed through the attenuator 40, is fed to a square wave to triangle wave circuit 50, which converts the square wave into a triangle wave. In this embodiment the square wave to triangle wave circuit comprises an operational amplifier 54, a resistor 56 and a capacitor 58. The square wave dithering signal is fed to the noninverting input of the operational amplifier 54. The output of the operational amplifier 54 is fed as feedback into the inverting input of the operational amplifier 54. The output of the operational amplifier 54 is also fed across a resistor 56 to the phase-locked loop 52. One end of a capacitor 58 is electrically connected to the circuit between the resistor 56 and the phase-locked loop 52. The other end of the capacitor 58 is grounded. RC is chosen to draw a lot of current from the operational amplifier. This is done by making C, the capacitance, large and R, the resistance, small.

The signal through the resistor 56 has been converted from a square wave signal to a triangle wave signal and is fed to a summing circuit 60 in the phase-locked loop 52. The summing circuit 60 sums the output from resistor 56 with output from a phase detector (multiplier) 70 in the phase-locked loop 52. The output from the summing circuit 60 is fed to a low pass filter 74, which filters out the ac component of the output from the summing circuit 60 and passes the dc component of the output. The output of the low pass filter 74 is used as input to a voltage control oscillator (VCO) 76. The VCO has a variable output frequency which in this embodiment is centered on approximately eight times the frequency of $f_{ref}$. The voltage input to the VCO 76 causes an approximately proportional frequency shift in the VCO output signal, with a corresponding phase shift in the VCO output signal. The output of the VCO 76 is used as CLK in this embodiment as it was used in the previous embodiment. As in the previous embodiment, part of the output of the VCO 76 is directed to a frequency divider 78, which divides down the frequency of the output of the VCO 76. In this embodiment the output frequency is divided by eight. The output of the frequency divider 78 is fed to the phase detector 70. The phase detector 70 compares the output of the frequency divider with the reference input signal as described in the previous embodiment.

The foregoing description of preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for measuring the phase shift between a reference input signal and a measured input signal with leading edges, comprising the steps of:
   generating a dithered clock signal with a rising edge, and a constantly varying phase;
   measuring the phase difference between the reference input signal and the measured input signal when triggered by the dithered clock signal; and
   averaging a plurality of measurements of the phase differences between the reference input signal and the measured input signal.

2. A method for measuring the phase shift as claimed in claim 1, wherein the step of generating a dithered clock signal, comprises the step of adding a dithering signal to a clock signal, wherein the dithering signal has a frequency less than or equal to one half of the frequency of the measured input signal and wherein the averaging of a plurality of measurements is over at least one period of the dithering signal.

3. A method for measuring the phase shift as claimed in claim 2, wherein the step of adding the dithering signal to the clock signal, comprises the steps of:

summing the amplitude of the dithering signal with the amplitude of a DC signal to generate a summed DC signal;

generating an output signal that has a frequency that is proportional to the amplitude of the summed DC signal, wherein if the amplitude of the summed DC signal is zero then the frequency of the output signal is approximately N times the frequency of the reference signal, wherein N is a number greater than or equal to two;

using the output signal as the dithered clock signal;

dividing down part of the output signal by N to produce a divided down signal which has an average frequency which is approximately equal to the frequency of the reference input signal;

measuring the phase difference between the reference input signal and the divided down signal; and generating the DC signal, which has an amplitude proportional to the phase difference between the reference input signal and the divided down signal.

4. A method for measuring the phase shift as claimed in claim 3, wherein the step of measuring the phase difference between the reference input signal and the measured input signal, comprises the steps of:

synchronizing the reference input signal with the dithered clock signal to create a synchronized reference signal; and synchronizing the measured input signal with the dithered clock signal to create a synchronized measured signal.

5. A method for measuring the phase shift as claimed in claim 4, further comprising the steps of:

dividing down the synchronized measured signal frequency by M, wherein M is a number greater than or equal to two to generate a signal with a frequency equal to the frequency of the synchronized measured signal frequency divided by M; and using the divided down signal as the dithering signal.

6. A method for measuring the phase shift as claimed in claim 5, wherein M is a whole number and M measurements of the phase differences between the reference input signal and the measured input signal are averaged together.

7. A method for measuring the phase shift as claimed in claim 6, wherein the step of measuring the phase difference between the reference input signal and the measured input signal, further comprises the steps of:

comparing the synchronized reference signal with the synchronized measured signal and decrementing a major value if only a leading edge of the synchronized reference signal is encountered and incrementing the major value if only a leading edge of the synchronized measured signal is encountered;

setting a minor value to N-1 when a leading edge of the synchronized reference signal is encountered;

decrementing the minor value by one with each rising edge of the dithered clock signal encountered subsequent to the leading edge of the synchronized reference signal;

accumulating a running sum of the major and minor values when a leading edge of the synchronized measured signal is encountered for a full period of the dithering signal.

8. A method for measuring the phase shift as claimed in claim 7, wherein the step adding the dithering signal to the clock signal, further comprises the step of, filtering the DC signal before it is summed with the amplitude of the dithering signal.

9. A method for measuring the phase shift as claimed in claim 7, wherein the step adding the dithering signal to the clock signal, further comprises the step of, filtering the summed DC signal.

10. A method for measuring the phase shift as claimed in claim 9, wherein the step of adding a dithering signal to the clock signal, further comprises the step of converting the dithering signal from a square wave to triangle wave before summing it with the DC signal.

11. An apparatus for measuring the phase shift between a reference input signal and a measured input signal with leading edges, comprising:

means for generating a dithered clock signal with a rising edge, an average frequency greater than or equal to the frequency of the reference input signal, and a constantly varying phase;

means for measuring the phase difference between the reference input signal and the measured input signal when triggered by the dithered clock signal; and means for averaging a plurality of measurements of the phase differences between the reference input signal and the measured input signal.

12. An apparatus for measuring the phase shift as claimed in claim 11, wherein the means for generating a dithered clock signal, comprises;

means for generating a dithering signal which has a frequency less than or equal to one half the frequency of the measured input signal, wherein the means for averaging a plurality of measurements averages the measurements over at least one period of the dithering signal; and a phase-locked loop.

13. An apparatus for measuring the phase shift as claimed in claim 12, wherein the phase-locked loop further comprises;

means for adding the dithering signal with a signal from the phase-locked loop;

a voltage controlled oscillator which has as input the output from the adding means, and which has an output frequency which is centered on approximately N times the frequency of the reference signal, wherein N is a number greater than or equal to two and wherein the output of the voltage controlled oscillator is the dithered clock signal;

a first frequency divider, which uses as input the output of the voltage controlled oscillator, and which divides down the frequency of the signal from the voltage controlled oscillator by N and produces as output a signal which has an average frequency which is approximately equal to the frequency of the reference input signal; and a phase detector, which receives as input the output from the frequency divider and the reference input signal, wherein the phase detector outputs a signal corresponding to the phase difference between the reference input signal and the output of the phase divider, and wherein the output of the phase detector is directed to the adding means as the input signal from the phase-locked loop.

14. An apparatus for measuring the phase shift as claimed in claim 13, wherein the means for measuring the phase difference comprises:

means for synchronizing the reference input signal with the dithered clock signal to create a synchronized reference signal; and means for synchronizing the measured input signal with the dithered clock signal to create a synchronized measured signal.

15. An apparatus for measuring the phase shift as claimed in claim 14, further comprising:
 a second frequency divider, which divides down the synchronized measured input frequency by M, wherein M is a number greater than or equal to two, to generate a signal with a frequency equal to the frequency of synchronized measured signal divided by M, which is used as the dithering signal.

16. An apparatus for measuring the phase shift, as claimed in claim 15, wherein M is a whole number and M measurements of the phase differences between the reference input signal and the measured input signal are averaged together.

17. An apparatus for measuring the phase shift as claimed in claim 16, wherein the means for measuring the phase difference between the reference input signal and the measured input signal further comprises:
 an anticoincidence device which receives as input the synchronized measured signal and the synchronized reference signal;
 a major up down counter which receives as input the output from the anticoincidence device, which produces a value in a register in the major counter;
 a minor counter, which receives as input the synchronized reference signal wherein the leading edge of the synchronized reference signal causes a register in the minor counter to be set to a value of N-1, and which receives as input the dithered clock signal wherein a rising edge of the dithered clock signal subsequent to the leading edge of the synchronized reference signal causes the value in the register of the minor counter to be decremented by one.
 a counter latch which receives the value in the register of the minor counter as input and and the value in the register of the major counter as input, and stores these values, and which receives the synchronized measured signal as input wherein a leading edge of the synchronized measured signal causes the counter latch to release the stored values as output; and
 an adder, which receives the output from the counter latch as input, and which accumulates the output from the counter latch for a full period of the dithering signal.

18. An apparatus for measuring the phase shift as claimed in claim 17, wherein the phase-locked loop further comprises a low pass filter which filters the output signal from the phase detector before the signal reaches the adding means.

19. An apparatus for measuring the phase shift as claimed in claim 17, wherein the phase-locked loop further comprises a low pass filter which filters the output of the adding means before the signal reaches the voltage controlled oscillator.

20. An apparatus for measuring the phase shift as claimed in claim 19, wherein the means for generating a dithering signal further comprises a square wave to triangle wave circuit which receives as input the signal from the second frequency divider, and wherein the output is sent to the adding means in the phase-locked loop.

* * * * *